United States Patent
Rey et al.

(10) Patent No.: US 9,638,847 B2
(45) Date of Patent: May 2, 2017

(54) METHOD FOR PRODUCING MICRON-RESOLUTION COLOURED IMAGES EMBEDDED IN A VERY ROBUST, VERY DURABLE MEDIUM

(75) Inventors: Alain-Marcel Rey, Mours St Eusebe (FR); Chrystel Deguet, Grenoble (FR); Laurent Frey, Fontaine (FR); Francois Tardif, Lans en Vercors (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 514 days.

(21) Appl. No.: 13/376,033

(22) PCT Filed: Jun. 4, 2010

(86) PCT No.: PCT/EP2010/057850
§ 371 (c)(1),
(2), (4) Date: Mar. 19, 2012

(87) PCT Pub. No.: WO2010/139794
PCT Pub. Date: Dec. 9, 2010

(65) Prior Publication Data
US 2012/0164399 A1    Jun. 28, 2012

(30) Foreign Application Priority Data
Jun. 4, 2009  (FR) .................... 09 53689

(51) Int. Cl.
*G02B 5/00* (2006.01)
*G02B 5/28* (2006.01)
(Continued)

(52) U.S. Cl.
CPC .............. *G02B 5/286* (2013.01); *C03C 17/34* (2013.01); *G02B 5/201* (2013.01); *G03F 7/0007* (2013.01);
(Continued)

(58) Field of Classification Search
CPC ...................................... G02B 5/286
(Continued)

(56) References Cited

U.S. PATENT DOCUMENTS 3,727,233 A    4/1973  Kanaya et al.
4,318,978 A *  3/1982  Borrelli et al. ............... 430/346
(Continued)

FOREIGN PATENT DOCUMENTS

DE    36 32 622 A1    4/1987
EP    0 064 780 A1    11/1982
(Continued)

OTHER PUBLICATIONS

International Search Report issued Jul. 15, 2010 in PCT/EP2010/057850.
(Continued)

*Primary Examiner* — Robert Vetere
(74) *Attorney, Agent, or Firm* — Oblon, McClelland, Maier & Neustadt, L.L.P.

(57) ABSTRACT

A method for producing a colored or fluorescent substrate with a view to formation of a colored or fluorescent image including the formation. The method defines on a substrate of a colored or fluorescent matrix, pixels of at least two different colors, wherein each pixel forms a filter for a given color. At least one filter is an interferential filter or a filter obtained with colored or fluorescent particles.

19 Claims, 11 Drawing Sheets

Figure 1A:
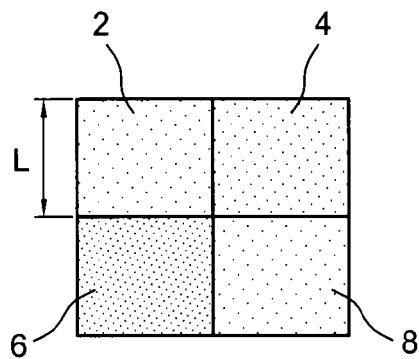

(51) Int. Cl.
  *C03C 17/34* (2006.01)
  *G02B 5/20* (2006.01)
  *G03F 7/00* (2006.01)

(52) U.S. Cl.
  CPC .... *C03C 2217/425* (2013.01); *C03C 2217/72* (2013.01); *Y10T 156/10* (2015.01); *Y10T 428/24802* (2015.01)

(58) Field of Classification Search
  USPC .......................................................... 427/64
  See application file for complete search history.

(56) References Cited

U.S. PATENT DOCUMENTS

| | | | |
|---|---|---|---|
| 4,359,519 A | | 11/1982 | Kraus et al. |
| 4,425,769 A | | 1/1984 | Hakoune |
| 4,431,695 A | | 2/1984 | Flatscher |
| 4,458,175 A | * | 7/1984 | Weekley ...................... 313/472 |
| 4,490,440 A | | 12/1984 | Reber |
| 4,534,620 A | * | 8/1985 | Gale ...................... H04N 9/045 348/E9.01 |
| 4,564,932 A | | 1/1986 | Langé |
| 4,592,623 A | * | 6/1986 | Yamamoto et al. ..... 359/487.02 |
| 4,604,329 A | | 8/1986 | Reber |
| 4,725,511 A | | 2/1988 | Reber |
| 4,946,546 A | | 8/1990 | Bourgeois-Moine |
| 5,058,997 A | * | 10/1991 | Dickerson ......... G02F 1/133516 349/105 |
| 5,217,832 A | * | 6/1993 | Joslin et al. ...................... 430/7 |
| 5,496,752 A | * | 3/1996 | Nasu ................... H01L 21/2236 257/E21.143 |
| 5,552,628 A | | 9/1996 | Watanabe et al. |
| 5,627,403 A | | 5/1997 | Bacchetta et al. |
| 5,795,821 A | | 8/1998 | Bacchetta et al. |
| 5,972,233 A | | 10/1999 | Becker et al. |
| 6,409,014 B1 | | 6/2002 | Hummell et al. |
| 6,514,621 B1 | | 2/2003 | Marietti et al. |
| 6,765,721 B2 | * | 7/2004 | Kawazu ............... G02B 5/3033 156/249 |
| 6,974,759 B2 | | 12/2005 | Moriceau et al. |
| 6,991,995 B2 | | 1/2006 | Aulnette et al. |
| 7,036,339 B1 | | 5/2006 | Chia et al. |
| 7,494,897 B2 | | 2/2009 | Fournel et al. |
| 2001/0018809 A1 | * | 9/2001 | Heropoulos .......... G06F 1/1601 40/544 |
| 2002/0060756 A1 | * | 5/2002 | Kurashina ......... G02F 1/136213 349/39 |
| 2002/0191233 A1 | | 12/2002 | Ishimoto et al. |
| 2003/0031842 A1 | | 2/2003 | Marietti et al. |
| 2004/0001947 A1 | * | 1/2004 | Kawamura ............. C03C 17/34 428/327 |
| 2004/0095644 A1 | * | 5/2004 | Berger et al. ................. 359/490 |
| 2005/0046817 A1 | | 3/2005 | Wolfe et al. |
| 2005/0130400 A1 | | 6/2005 | Grupp et al. |
| 2006/0209567 A1 | * | 9/2006 | Sakurai ................ G02B 6/0038 362/626 |
| 2008/0311725 A1 | | 12/2008 | Di Cioccio et al. |
| 2009/0091644 A1 | | 4/2009 | Mackey |
| 2009/0188611 A1 | | 7/2009 | Savoyet et al. |
| 2010/0310839 A1 | | 12/2010 | Rey et al. |
| 2011/0018132 A1 | | 1/2011 | Rey et al. |
| 2012/0120465 A1 | | 5/2012 | Martinez et al. |
| 2014/0286836 A1 | | 9/2014 | Clavaguera et al. |
| 2014/0318906 A1 | | 10/2014 | Deimerly et al. |

FOREIGN PATENT DOCUMENTS

| | | |
|---|---|---|
| EP | 0 322 967 A1 | 7/1989 |
| EP | 0 450 558 A2 | 10/1991 |
| EP | 0 450 558 A3 | 10/1991 |
| EP | 0 627 763 A1 | 12/1994 |
| EP | 0 669 561 A2 | 8/1995 |
| EP | 1 544 178 A1 | 6/2005 |
| EP | 1 918 123 A1 | 5/2008 |
| EP | 2 085 241 A1 | 8/2009 |
| FR | 339 223 A | 1/1905 |
| FR | 364 493 A | 8/1906 |
| FR | 2 448 167 A2 | 8/1980 |
| FR | 2 493 019 A1 | 4/1982 |
| FR | 2 789 517 A1 | 8/2000 |
| FR | 2 816 445 A1 | 5/2002 |
| FR | 2 850 487 A1 | 7/2004 |
| FR | 2 851 496 A1 | 8/2004 |
| FR | 2 855 908 A1 | 12/2004 |
| FR | 2 888 402 A1 | 1/2007 |
| FR | 2915614 A1 | 10/2008 |
| FR | 2 926 747 A1 | 7/2009 |
| FR | 2 926 748 A1 | 7/2009 |
| WO | WO 99/33760 A1 | 7/1999 |
| WO | WO 99/55188 A1 | 11/1999 |
| WO | WO 2008/012235 A1 | 1/2008 |

OTHER PUBLICATIONS

French Preliminary Search Report issued Jan. 29, 2010 in Patent Application No. 0953689 with English translation of categories of cited documents.
H. A. MacLeod, "Thin film optical filter", Adam Hilger Ltd, 1969, pp. 266-281.
Samar Kumar Medda, et al., "Synthesis of Au nanoparticle doped $SiO_2$-$TiO_2$ films: tuning of Au surface plasmon band position through controlling the refractive index", Journal of Materials Chemistry, 2005, vol. 15, pp. 3278-3284.
Richard L. Baer, et al., "A Comparison of Primary and Complementary Color Filters for CCD-based Digital Photography", IS&T/SOPIE Conference on Sensors, Cameras and Applications for Digital Photography, SPIE, 3650, Jan. 1999, pp. 16-25.
H. Baumann, et al., "Bonding of Structured Wafers", Proceedings of the Third International Symposium on Semiconductor Wafer Bonding: Physics and Applications, Electrochemical Society Proceedings, vol. 95-7, May 1995, pp. 471-487 with cover page.
F. Seigneur, et al., "Laser Soldering of LTCC Hermetic Packages with Minimal Thermal Impact", de 16th IMAPS European Microelectronics & Packaging Conference (EMPC), 2007, pp. 526-530.
J. C. Stoffel, et al., "A Survey of Electronic Techniques for Pictorial Image Reproduction", IEEE Transactions on Communications, vol. COM-29, No. 12, Dec. 1981, pp. 1898-1925.
Kawata, "Near-Field Optics and Surface Plasmon Polaritons," Topics in Applied Physics, vol. 81, 2001.
Kelly et al., "The Optical Properties of Metal Nanoparticles: The Influence of Size, Shape, and Dielectric Environment," J. Phys. Chem. B, 2003, 107, pp. 668-677.
Office Action mailed Nov. 10, 2016, in European Patent Application No. 10 724 774.4 (with partial English-language translation).

* cited by examiner

METHOD FOR PRODUCING MICRON-RESOLUTION COLOURED IMAGES EMBEDDED IN A VERY ROBUST, VERY DURABLE MEDIUM

TECHNICAL FIELD AND PRIOR ART

The present invention concerns a method for reproducing coloured images, with a resolution which may be micronic, embedded within a massive object including at least one transparent window through which they can be seen.

These images have outstanding robustness characteristics, with excellent reproductive quality.

The first application is in the field of permanent and very robust decoration of all types of products, such as jewels, watch-glasses, windows or screens of roaming electronic equipment.

The invention notably enables the extremely durable storage of colour images in the form of pixels with different optical transmission levels ("directly visible"), occupying a small volume whilst guaranteeing very satisfactory resolution.

Another type of application is the conservation of the heritage of humanity for millennia, or again the archiving, for centuries, of documents, for example a selection of photographs.

Techniques for production of extremely robust monochrome images, at micron scale, with excellent definition, are defined in patent applications FR 0 850 475 and 0 850 472.

With regard to the printing of colour images on flexible or rigid media, there are many techniques. However, the currently known techniques do not enable very small-sized fixed colour images to be reproduced. Nor do they allow images which are resistant to mechanical aggressions (for example scratches), and/or chemical aggressions, and/or biological aggressions (for example moulds) and/or thermal aggressions (for example fires) to be reproduced.

CMOS or CCD image sensors use small coloured pixels. But, firstly, they are not intended for the preservation of fixed images. Secondly, they are not resistant to high temperatures (>400° C.).

Stocks of images in digital form are subject to three major forms of obsolescence:
- deterioration of the storage medium: depending on the media deterioration is more or less rapid, but it is commonly accepted that the lifetime of recordable CDs or DVDs does not exceed 5 years,
- obsolescence of the software and hardware: the files can be kept in their original form in new technical environments only if they are converted, often with an unacceptable loss of function and loss of content,
- the appearance of new computerised peripheral systems makes the media which are commonly used for a period obsolete; one might mention, for example, the disappearance of 5¼ inch magnetic diskettes.

In addition, storage in digital form is not safe: duplicates (copies) are made of the data, but each medium on which a copy is made faces the same problems, set out above, as the original medium (no resistance to high temperature, deterioration after a certain period, rapid obsolescence, etc.).

Another problem is that storage in digital form is vulnerable to tampering.

As for techniques which use LCD screens, they require a mechanical alignment which is difficult to accomplish.

The problem of finding a new method for memorising polychromatic image data is therefore posed.

Such a method allows data to be preserved for a very long period, of several years, or several tens of years, or more than 100 years.

According to another aspect, the problem is posed of finding a new method for producing robust and durable colour images, which are very resistant to temperature, at least 200° C., or even which are resistant at a temperature of several hundred degrees, for example 600° C. or 900° C., or even higher.

ACCOUNT OF THE INVENTION

The invention firstly concerns a method for producing a coloured substrate with a view to the formation of a coloured or fluorescent image including the formation, on a substrate, of a coloured matrix, defining pixels of at least two different colours, where each pixel forms a filter. At least one series of coloured pixels is obtained by means of an interferential filter or coloured particles.

The pixels are formed independently of an image to be reproduced, and before the formation of any image. A method according to the invention therefore enables a coloured substrate to be produced, by using at least 3 levels of photolithography, one level for each colour. For each colour, the photolithography level may include the production of a lithograph in photosensitive resin, followed by its transfer by etching into the lower layers.

By this means it is possible to produce multiple substrates, which can therefore be prepared in advance and stored. These substrates therefore constitute standard objects, and each can then be used directly to produce an image, whatever this image may be.

A substrate is preferably used which has a format used in the field of microelectronics, for example a circular substrate which is 100 mm, or 150 mm, or 200 mm or 300 mm in diameter. As a variant, it is possible to use a rectangular substrate of the type used in the flat screen manufacturing industry. One may cite, for example, EAGLE X C™ glass from CORNING, which is available up to the size of generation 8 (2160 mm×2460 mm) for thicknesses of around 0.5 mm.

The intensity of each colour is obtained by placing above each colour pixel a mask which partially obstructs the passage of light. The dimension of this mask calculated according to a rasterisation principle is directly related to the greyscale of the initial colour.

Each pixel may be obtained with coloured particles, where these particles are of the mineral or organic type. For example, the particles are:
- of mineral type, and include an oxide, such as iron oxide, chromium oxide, manganese oxide or aluminium oxide or including a spinel, or chromium, or cobalt,
- or organic, of the phtalocyanine type.

In the case of particles of mineral type, a particularly robust and temperature-resistant substrate is obtained.

The particles can be formed using particles with a surface plasmon effect, of the Au, Ag or Pt type, or again using organic molecules included in a mineral matrix.

As a variant, the particles may be coated in refractory materials of the aluminia, zirconia or zircon type.

Intermediate layers can be produced to adjust the optical indices.

According to another embodiment, each pixel is a dielectric-dielectric or metal-dielectric interferential filter.

Each colour may be obtained through the deposition of at least one layer and etching of this layer.

Each filter may be a dielectric-dielectric interferential filter, comprising an alternating stack of mineral layers.

If a filter is a metal-dielectric interferential filter it comprises an alternating dielectric-metal stack.

In a method according to the invention, it is also possible to use luminescent particles which are excitable at different wavelengths, and which enable the quantity of data to be increased (pseudo 3D storage).

After having produced a substrate according to the invention it is possible to produce an image, directly on or in the coloured substrate.

Production of a colour image preferably uses only a single level of photolithography from a previously prepared substrate. This notably enables the product manufacturing cycle time to be reduced.

An image may be produced by partial masking of at least one colour of the matrix.

This method therefore enables problems of mechanical alignment between a coloured substrate and a substrate with an image to be overcome when the colour function and the image function are accomplished on different media and subsequently assembled together. These alignment problems, which are found with LCD screens, are therefore avoided.

The invention also allows the production of small pixels (the maximum lateral dimension of which is of the order of 20 µm), with a very high degree of accuracy, for example less than or equal to 20 nm.

A fixed colour image is preferably produced, using methods derived from microelectronics technologies (lithography, depositions, etching and possibly thermal processing techniques).

The image can notably be produced by partial masking of at least one colour of the matrix, where the masking is accomplished by means of a metal mask, made for example from Pt, W, TiN or Ti. The image may be produced as a "positive" or as a "negative", depending on whether:

- one of or several opaque metal portions roughly centred on the centre of each pixel are permitted to remain, by eliminating lateral metal portions,
- or, conversely, one or more roughly central portions of each pixel are eliminated, leaving behind lateral metal portions.

A method according to the invention may also include a step of formation of a protective substrate. The latter is, for example, assembled with the matrix by molecular bonding.

The invention then enables a durable image to be produced, since the image portion is then embedded between two robust substrates.

The invention also concerns a substrate for the production of a coloured image including a coloured matrix, defining pixels of at least two different colours, where each pixel forms an interferential filter, or includes coloured or fluorescent particles, and where one or other may have the properties or characteristics set out above.

A substrate according to the invention can also include a protective substrate, preferably assembled with the coloured matrix by molecular bonding.

In a method or a device according to the invention, the substrate and/or the protective substrate is transparent at least at a wavelength of at least one of the colours of the matrix, such that it is possible to view the images through one or other of the substrates.

The present invention allows production of robust and durable colour images which are tamper-proof and highly resistant to temperature: the minimum resistance temperature may be 200° C. but, depending on the selected materials, a device according to the invention may be able to resist a temperature of several hundred degrees, for example 600° C. or 900° C., or even higher.

In the present invention the images are stored in analog form, without any encoding or compression. These images can be read by simple optical means based on immutable optical principles such as microscopes, which will always exist, and are not subject to obsolescence.

The technique provided by the invention is low-cost, simple and of very great industrial interest. It reduces cycle times. It enables a universal substrate to be produced, by means of which it is possible to store any image.

BRIEF DESCRIPTION OF THE ILLUSTRATIONS

Figure 1B:
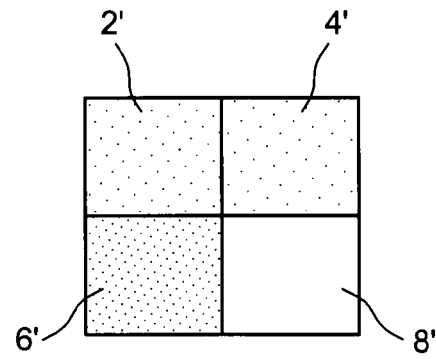
Figure 4A:
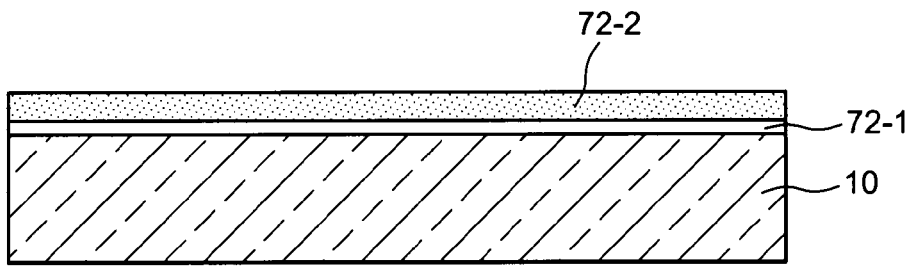
Figure 4B:
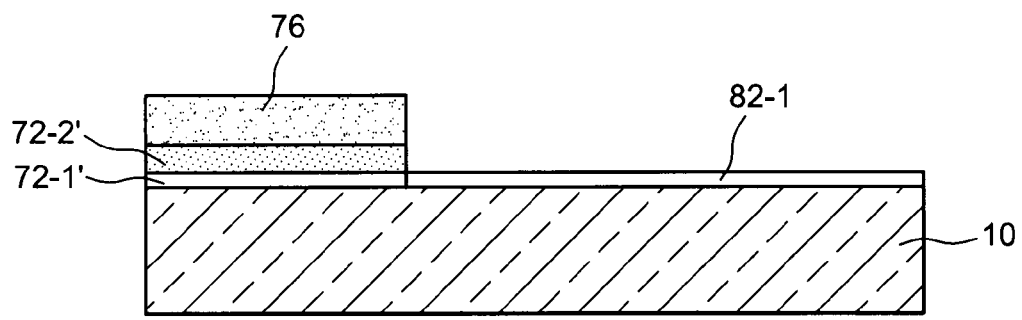
Figure 4C:
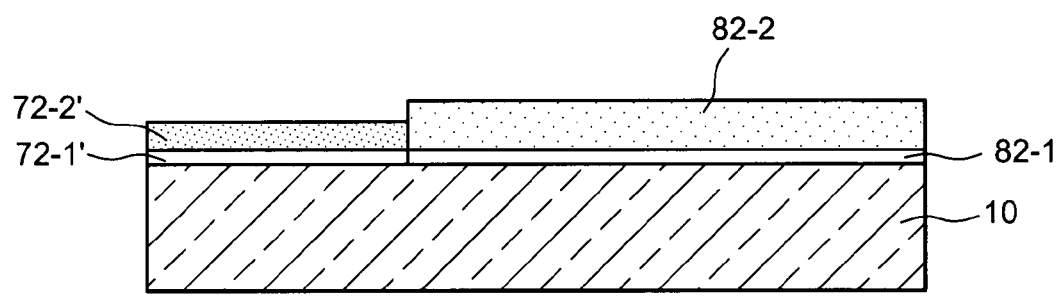
Figure 4D:
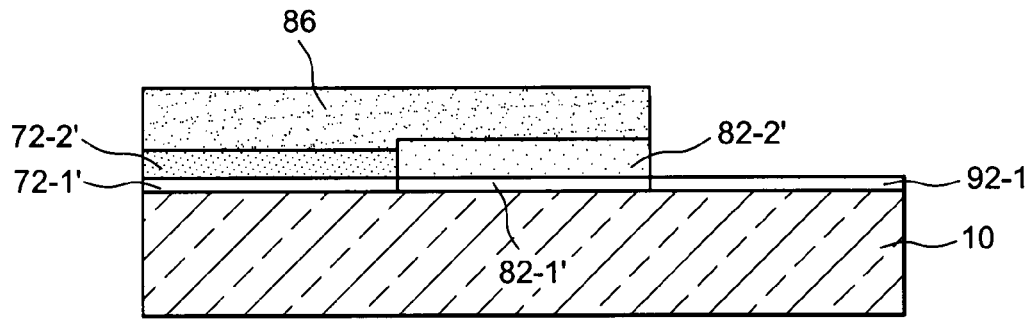
Figure 4E:
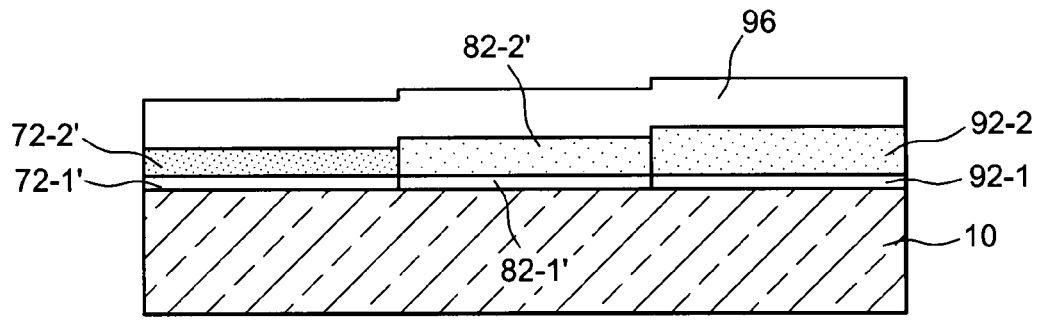
Figure 4F:
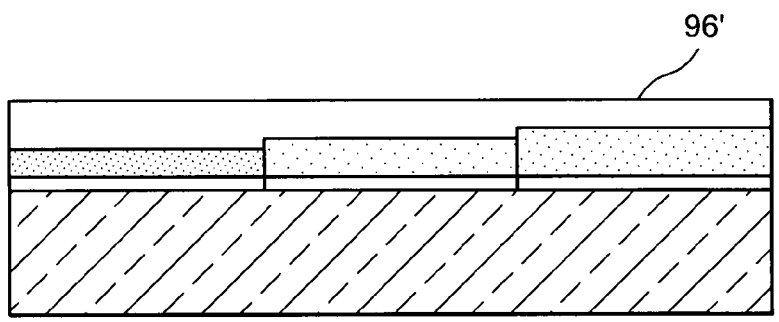
Figure 5A:
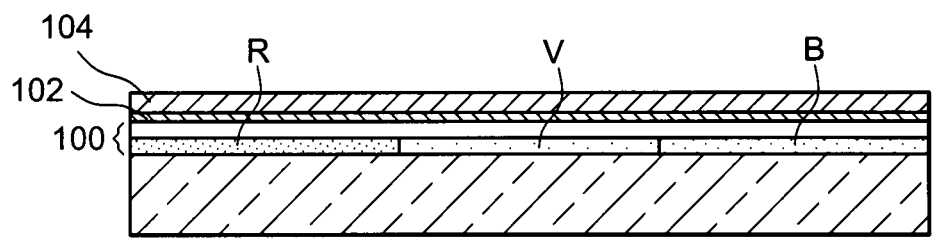
Figure 5B:
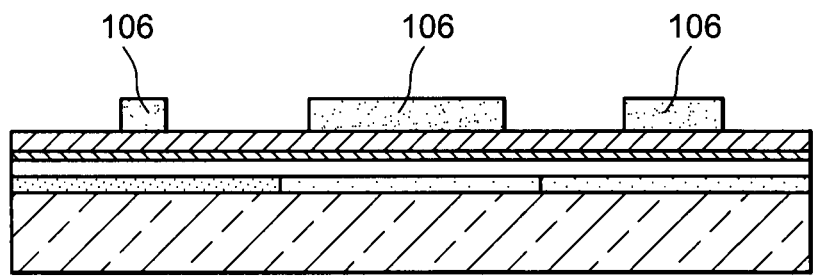
Figure 5C:
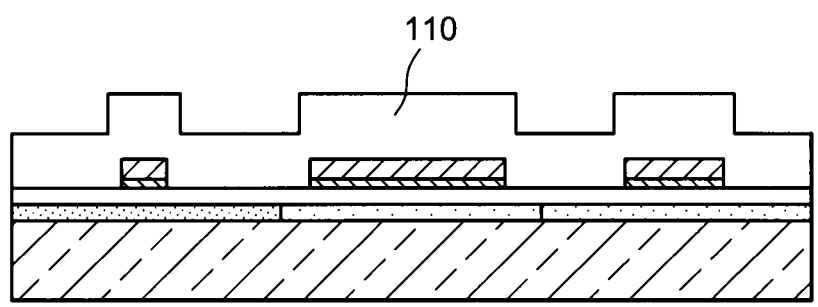
Figure 5D:
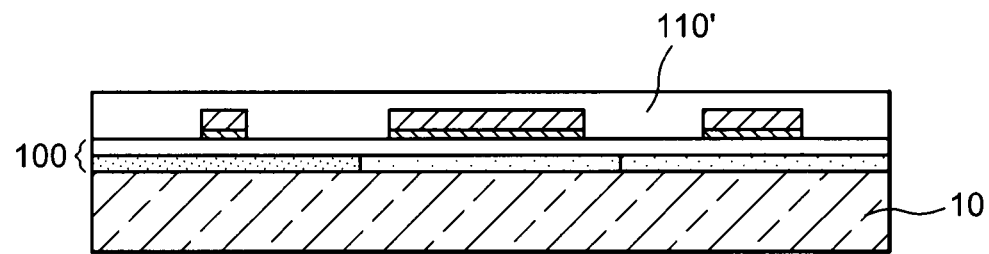
Figure 6A:
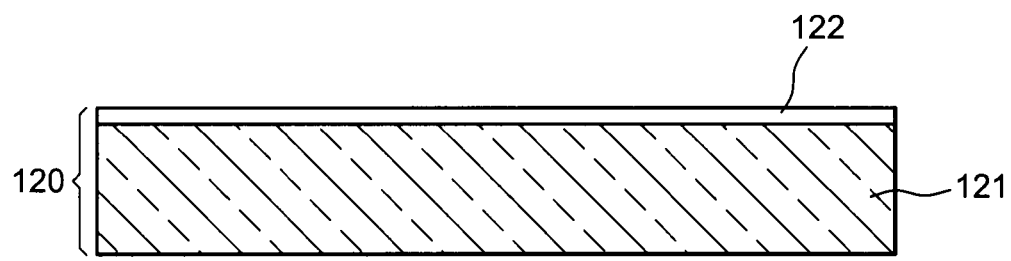
Figure 6B:
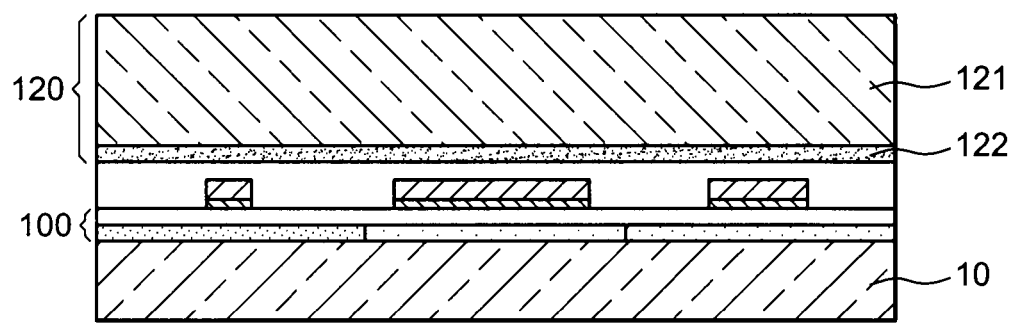

FIGS. 1A and 1B represent an example of organisation of the pixels for an image according to the invention, FIGS. 2A-2H represent steps of a first method of production of dielectric-dielectric interferential filters according to the invention, FIGS. 3A-3H represent steps of a second method of production of dielectric-metal interferential filters according to the invention, FIGS. 4A-4F represent steps of a third method of production of filters with nanoparticles according to the invention, FIGS. 5A-5D represent an embodiment of a colour image according to the invention, FIGS. 6A and 6B represent steps for the production of a colour image according to the invention.

Figure 7A:
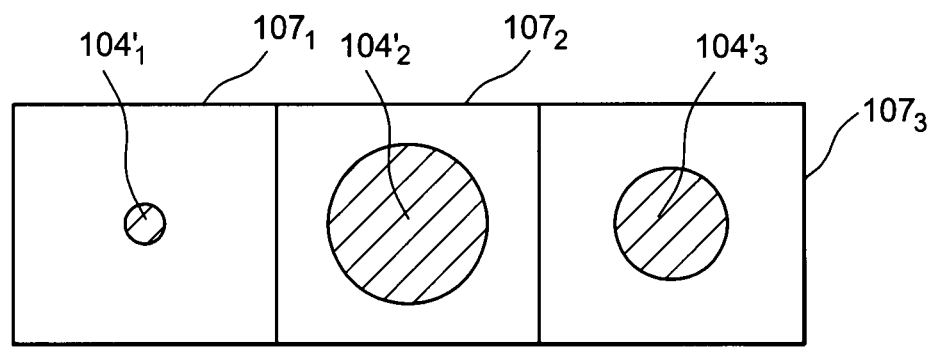
Figure 7B:
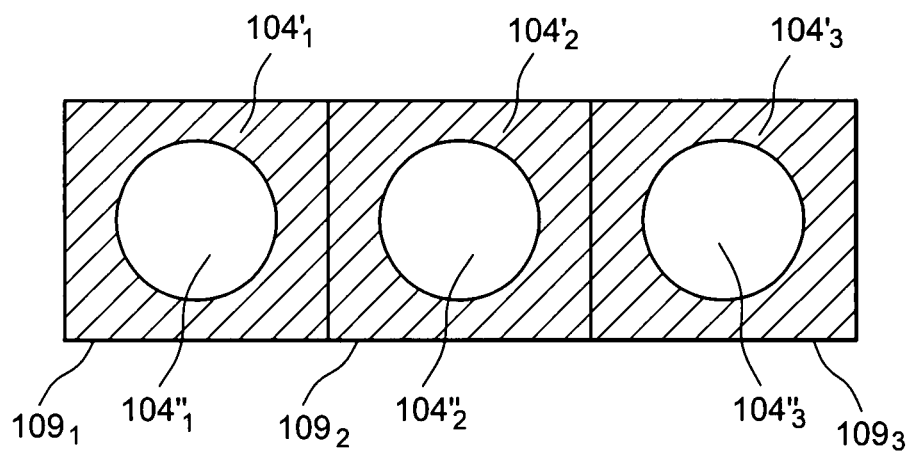

FIGS. 7A and 7B represent variants of a method for production of a colour image according to the invention.

DETAILED ACCOUNT OF THE EMBODIMENTS OF THE INVENTION

In a method according to the invention, a matrix of coloured or fluorescent pixels is produced on a substrate. Using this matrix an image can be produced by masking a portion of the pixels.

It is possible to produce coloured pixels with a breakdown into fundamental colours (Red, Green, Blue) or into complementary colours (Yellow, Cyan, Magenta, White), or into a larger number of colours.

Two examples of groups or elementary matrices of 4 pixels are given in FIGS. 1A and 1B.

The group of FIG. 1A is formed of 4 square pixels, two of which (pixels 2, 8) are green, one of which (pixel 4) is blue, and the other of which (pixel 6) is red.

The group of FIG. 1B is formed of 4 square pixels 2', 4', 6', 8', one of which (pixel 2') is cyan, the second of which (pixel 6') is magenta, the third of which (pixel 8') is white, and the fourth of which (pixel 4') is yellow. As previously mentioned above, other combinations are possible.

One or other of these matrices of 4 coloured pixels can be repeated regularly, and cover the entire surface of a substrate, for example one made from glass, a ceramic material or sapphire. The colour is characterised by the central wavelength of the transmitted spectrum, and by the breadth of its spectral distribution.

The materials used for production of the coloured pixels are preferably materials which are able to resist high temperatures, of between 200° C. and 900° C. or higher.

The precise choice of the materials depends firstly on the type of substrate used, and secondly on the methods of manufacture chosen according to the robustness of the product sought. For example, with glass the temperature may exceed 400° C., while with sapphire or ceramics it is possible to go as high as 1000° C., or even higher.

If the device is intended to resist a temperature higher than 900° C. the substrate will preferably be made from sapphire, diamond or a ceramic material. The filter will then preferably be of the dielectric-dielectric type, or of the particles type (depending on the type of particles).

If the device is intended to resist a temperature of roughly between 600° C. and 900° C. the substrate will preferably be made from sapphire, diamond or a ceramic material. The filter will then preferably be of the dielectric-dielectric type, or of the particles type (depending on the type of particles).

If the device is intended to resist a temperature of roughly between 200° C. and 600° C. the substrate may be made of glass. The filter will then preferably be of the dielectric-dielectric or dielectric-metal type, or of the particles type (depending on the type of particles).

These are merely examples; other combinations of materials may be used.

It is possible to use various methods to produce a matrix of coloured pixels. 3 methods are described below. Each method enables matrices of pixels to be produced, particularly of the type of those represented in FIGS. 1A and 1B.

According to a first method, a dielectric-dielectric interferential filter is produced (i.e. one of the pixels, for example of the type represented in FIG. 1A or 1B), by alternate stacking of mineral layers. These layers may be more or less resistant to high temperatures. They are preferably transparent. At least a portion of the layers has a low refractive index (for example n<1.5, such as: $MgF_2$ (n=1.35) or $SiO_2$ (n=1.45)), while at least another portion has a high refractive index (for example n>1.5 or than 1.8, such as: $TiO_2$ (n=2.2) or $Si_3N_4$ (n=2)). The filter then consists of alternating high-index and low-index layers.

The optical characteristics of the layers and the desired spectral response enable the filter, i.e. the number of layers to be deposited and their thicknesses, to be calculated. On this subject, reference may be made, for example, to the work "Thin film optical filters", by H. A. MacLeod, Adam Hilger Ltd, 1969.

With materials such as silicon oxide (SiO2) and silicon nitride (Si3N4) it is possible to have around 10 layers, where the typical thickness of each is between 20 nm and 150 nm, in order to obtain a satisfactory filter. The choice of thicknesses enables the filter to be centred on the desired wavelength.

Each colour (i.e. one of the pixels, for example of the type represented in FIG. 1A or 1B) is therefore obtained with a filter formed of layers of thicknesses different to the thicknesses of the layers forming another colour.

A filter produced in this manner is resistant up to a certain temperature, as previously mentioned above. In general, the nominal properties of this type of filter are maintained only for an observation in a direction normal to the surface of the filter.

Such a filter is highly sensitive to the angle of observation. It also has satisfactory colorimetric properties, and also a satisfactory signal-to-noise ratio.

The thickness of a filter does not preferably exceed 10% of the maximum lateral dimension of a pixel (i.e., for example 10% of L, where L is given in FIG. 1A). This enables the pixel's edge effects to be minimised.

A coloured substrate can now be produced.

To this end, a multilayer 12 (produced as explained above) is deposited on a substrate 10 (FIG. 2A), which may be either transparent or opaque, for a first colour (as previously defined above), possibly covered by a buffer layer 14, which is optically neutral (i.e. having a relatively flat absorption spectrum for the wavelengths in the visible field). A thermal treatment may be applied; it enables the layers to be stabilised, and possible subsequent annealings to be prepared. The buffer layer enables the method of production of the next multilayer to be prevented from impairing the previously produced multilayer; it also allows a final chemical mechanical polishing.

Figure 2A:
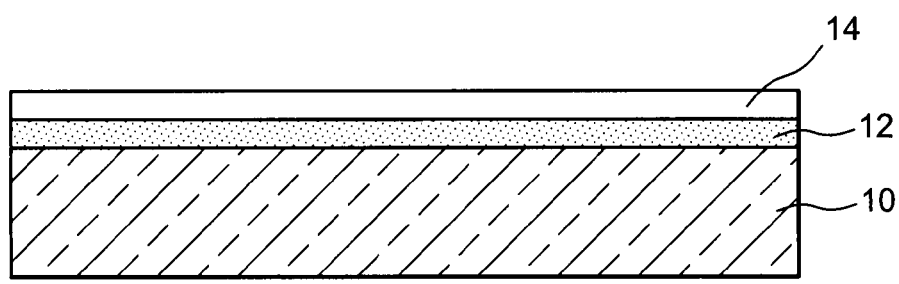
Figure 2B:
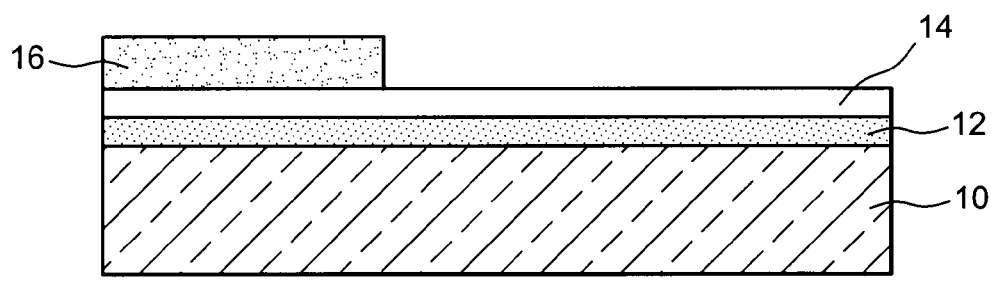

A mask 16 is then produced to delimit the first colour (FIG. 2B). A layer of photosensitive resin is therefore deposited, in which a lithograph is produced to form the mask. This covers the portions to be protected during the following etching step. With this mask a pixel is defined.

Figure 2C:
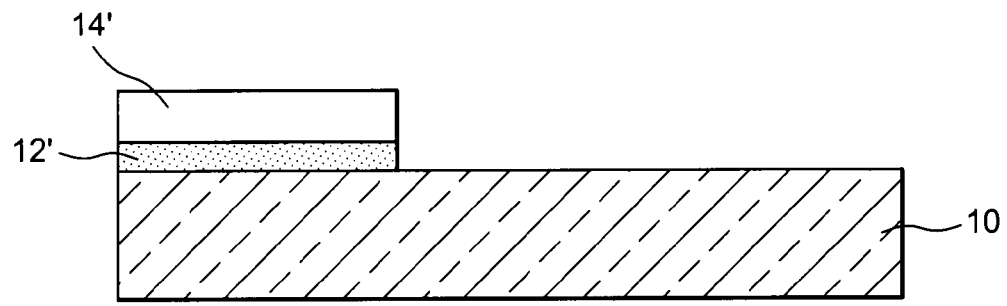
Figure 2D:
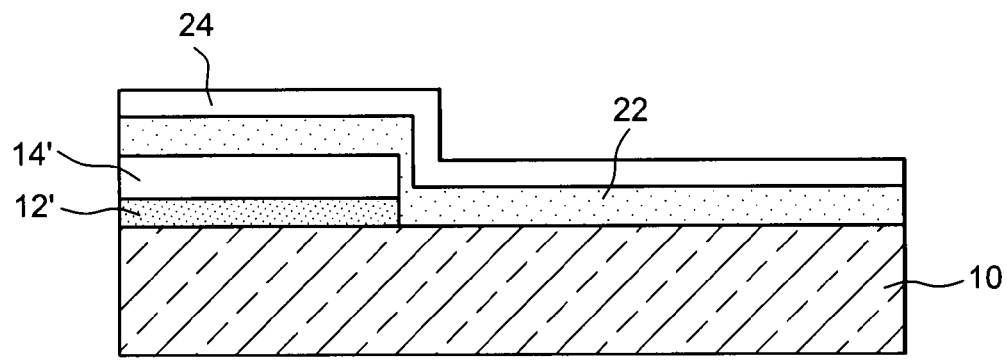
Figure 2E:
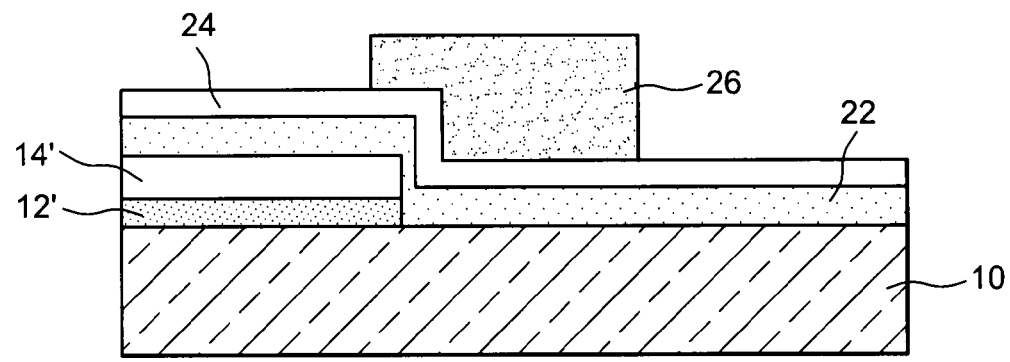

Buffer layer 14 and filter 12 can then be etched by anisotropic dry etching (for example by reactive ion etching or ionic milling). Masking layer 16 is then removed (FIG. 2C). A residual portion 14' of layer 14 and a residual portion 12' of layer 12 therefore remain on the substrate. A first coloured pixel has thus been produced.

A second coloured filter (or pixel) is then produced.

To this end, a multilayer 22 for a second colour is deposited on residual part 14' of buffer layer 14 and on a portion of substrate 10, and this multilayer may possibly be covered with a buffer layer 24 which is optically neutral. It is supposed in what follows that there is a buffer layer 14 but, as previously mentioned, it is not obligatory.

A mask 26 is then produced to delimit the second colour. A layer of photosensitive resin is therefore deposited, in which a lithograph is produced to form the mask (FIG. 2E), which covers the portions to be protected during the following etching step. In this figure mask 26 partly covers stack 12'-14'-22-24 and partly stack 22-24. This coverage means that no hole is left between the first stack and the second stack, after etching, bearing in mind the alignment tolerances of the lithograph with mask 26, compared to the lithograph with mask 16. The proportion of coverage between the two adjacent portions depends on the characteristics of the lithography equipment; it is typically between 0.5 and 2 μm.

Figure 2F:
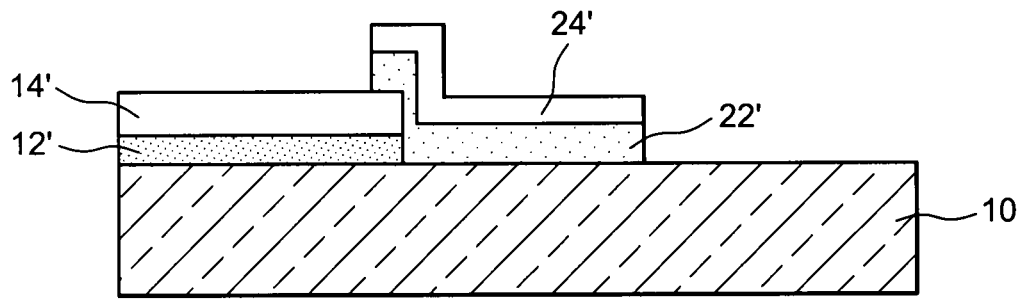

Buffer layer 24 and the filter can then be etched by anisotropic dry etching (for example by reactive ion etching or ionic milling). Masking layer 26 is then removed (FIG. 2F).

Stack 12', 14', previously described above, therefore remains, which has not been affected by this step, and a portion 22', 24' of each layer 22, 24, where portion 22' of layer 22 is at least partly in contact with the surface of substrate 10, and where it can partly be on buffer layer 14' or on layer 12' if there is no buffer layer 14.

A third coloured filter or pixel is then produced.

Figure 2G:
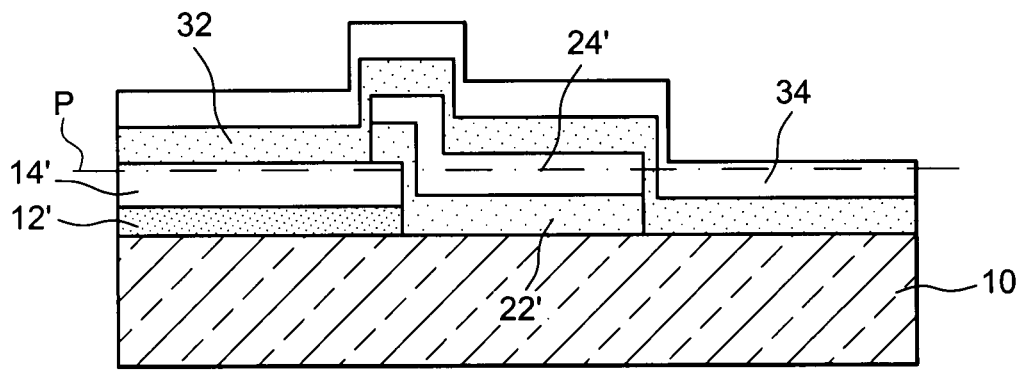

To this end, a multilayer 32 for a third colour is deposited on residual part 24' of buffer layer 24 and on a part of residual portion 14', possibly covered with a buffer layer 34, which is optically neutral (FIG. 2G). It can be seen that, here again, the layers intended to constitute the third coloured filter or pixel and, at least, the layers of stack 12', 14' are covered.

The buffer layers have portions at the same height relative to the surface of substrate 10. As can be seen in FIG. 2G, a plane P, parallel to the surface of substrate 10, on which the depositions are made, passes through all 3 buffer layers, or through all 3 filters 12', 22', 32 if there are no buffer layers.

Figure 2H:
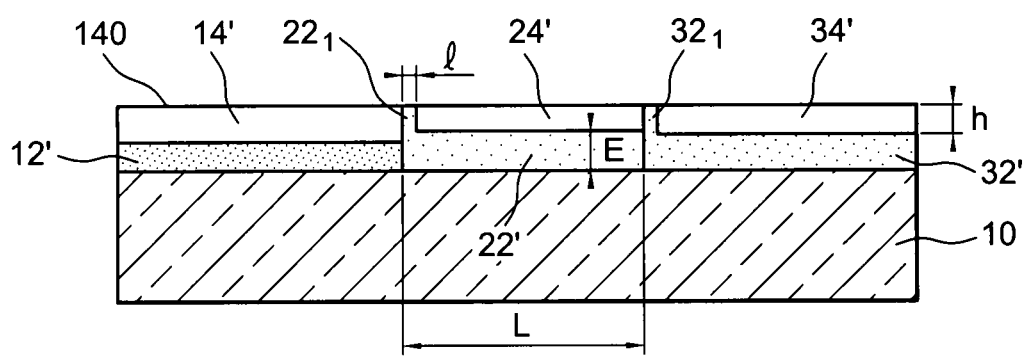

A step of planarisation by chemical mechanical polishing of the entire structure, with stoppage in the buffer layers, in plane P, is the final step in the method. All the portions of layers 14', 24', 34 located above plane P are thus eliminated (FIG. 2H).

A flat surface 140 is consequently obtained in or under which a matrix of coloured filters or pixels has been produced.

As explained above, the formation of the second pixel preferably implements a deposition of layers with at least partial coverage of the zones or layers forming the first pixel. Similarly, the formation of the third pixel preferably implements a deposition of layers with at least partial coverage of the zones or layers forming the second pixel.

The advantage of these coverages, which it could be sought to avoid, is that they allow excellent auto-alignment of the adjacent pixels.

In addition, as will be understood from the succession of steps of FIGS. 2F-2G, the technique used allows lateral portions $22_1$, $32_1$ of materials of these layers to persist, for each pixel, above the surface of each of layers 12', 22', 32'. Width 1 of each of these lateral portions $22_1$, $32_1$, above the surface of corresponding filter 22', 32', is at most equal to the thickness of portion 22', 32'. Depending on the deposition technique of the layer used, for example by evaporation or collimated cathodic sputtering, width 1 may be reduced to less than 10% of the thickness of portions 22', 32'. Width 1, for each pixel, of this lateral portion $22_1$, $32_1$ of filter material 12', 22', 32' which results from the coverage may thus be controlled and minimised, enabling the matrix, or an image which will be produced subsequently, to be disrupted as little as possible. For example, in the case of a pixel the total area occupied by edges $22_1$, $32_1$, represents less than 4% of the pixel's total area.

By this means it is possible to produce pixels having, in both dimensions of the plane in which the pixels are produced, a lateral dimension of between 1 μm and 1 mm, and preferably of the order of a few micrometers, for example between 5 μm and 15 μm.

The portions of the layers which have not been eliminated therefore remain visible; this concerns portions 14', 24' and a portion 34' of buffer layer 34 in the diagram of FIG. 2H. If buffer layers are not used, 3 portions 12', 22', 32' then remain and, in this case, portions $22_1$ and $32_1$ do not exist.

A method of manufacture to produce a matrix of pixels with 3 colours was given above. To produce a matrix with 4 or more colours, all the steps relative to the production of the second colour (deposition, lithography, etching) must simply be repeated.

According to a second method, a metal-dielectric interferential filter is produced, by alternate stacking of a dielectric material and a metal.

The optical properties of the materials (n, refractive index and k, the attenuation coefficient) and the spectral responses (central wavelength, breadth of spectral response, maximum transmission and rejection) enable the filters to be calculated, i.e. the thicknesses of the layers and the number of layers; to this end reference may, for example, be made to application WO 2008/012235.

With materials such as silicon nitride (Si3N4) for the dielectric and silver (Ag) for the metal, a filter for one of the 3 fundamental colours may be obtained with, for example, 7 layers, including 3 metal layers, each of which is typically between 15 nm and 40 nm thick, and 4 dielectric layers, each of which is typically between 1 nm and 1000 nm thick, and advantageously between 5 nm and 100 nm thick.

A filter for a colour may be obtained by modifying the thicknesses of only 2 dielectric layers of a filter for another colour.

This example with the Si3N4/Ag pair enables the method to be applied generally to any dielectric/metal pair.

A filter produced in this manner has temperature properties which are restricted by the choice of metal.

It has a sensitivity to the angle of observation which is lower than that of a filter obtained by the previous method, since it has a larger number of layers.

It has satisfactory colorimetric properties and a satisfactory signal-to-noise ratio.

A method of production of the coloured substrate may be identical to the one described in the case of dielectric-dielectric filters, replacing one of the dielectrics by the metal.

A method specific to metal/dielectric filters, in order to produce a coloured substrate with colours, using these filters, will be described in connection with FIGS. 3A-3G.

A first coloured filter is firstly produced.

Figure 3A:
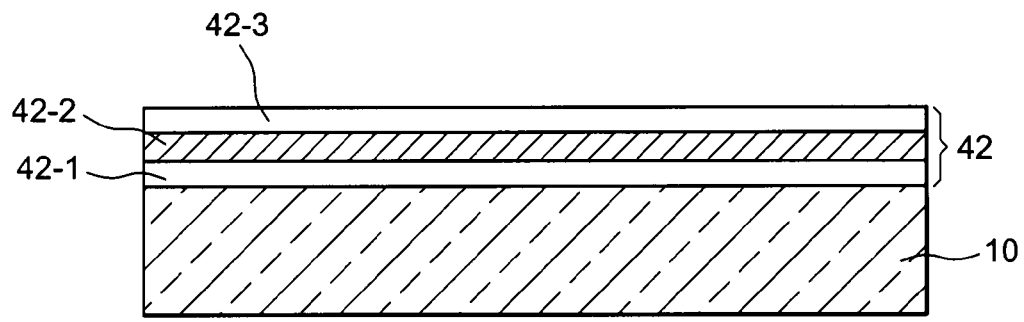

To this end, a first multilayer 42, of the type which has just been described (layer 42-1 dielectric/layer 42-2 metal/layer 42-3 dielectric), is deposited on a transparent or opaque substrate 10, in order to produce a first colour (FIG. 3A).

Figure 3B:
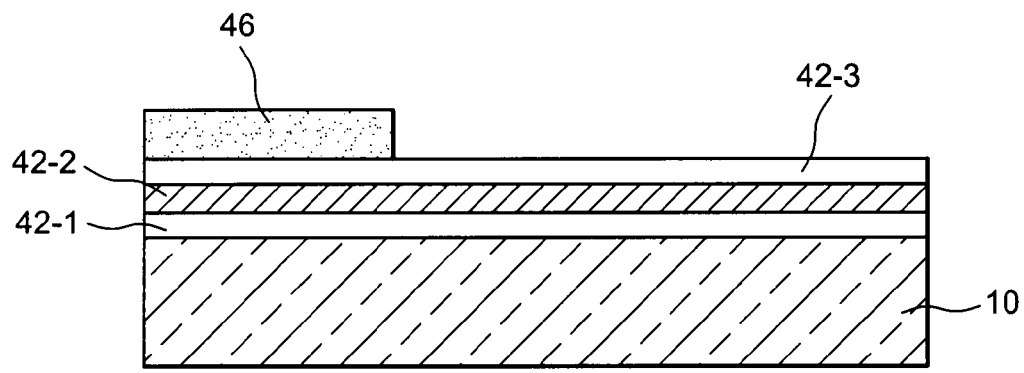

A mask 46 is then produced to delimit the first colour. A layer of photosensitive resin is therefore deposited, in which a lithograph is produced to form the mask (FIG. 3B).

Figure 3C:
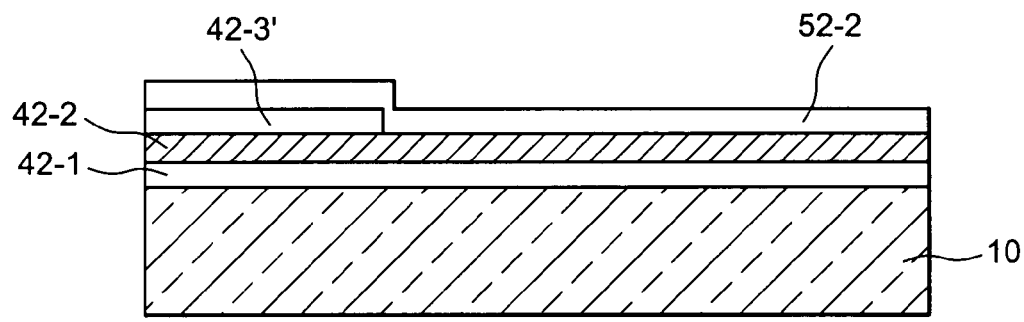
Figure 3D:
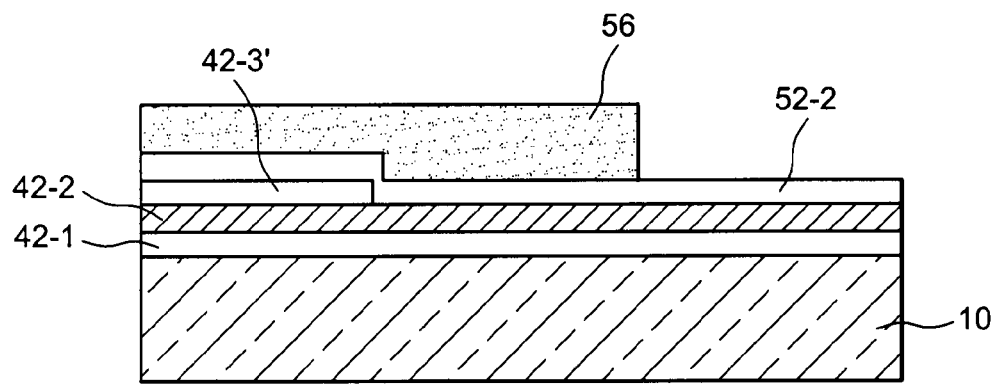

Dielectric layer 42-3 can then be etched, by anisotropic dry etching (reactive ion etching or ion milling). Mask 46 protects the portions which are not etched. A stack including both layers 42-1 and 42-2 and a portion 42-3' which is not eliminated by etching of layer 42-3 is therefore obtained (FIG. 3C).

Mask layer 46 is removed and dielectric layer 52-2 is deposited for the purpose of producing the second colour. This latter layer covers portion 42-3' of layer 42-3 which has been protected by the mask and the portion of layer 42-2 which has been revealed during the etching of layer 42-3'.

A mask 56 is then produced on dielectric layer 52-2 to delimit the second colour.

Figure 3E:
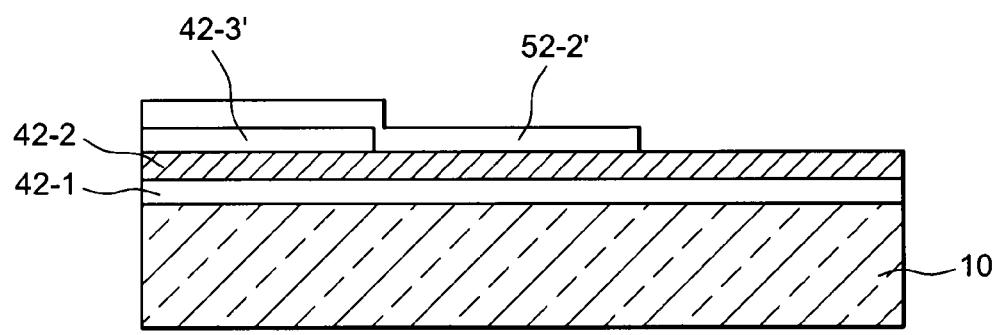

A layer of photosensitive resin is therefore deposited, in which a lithograph is produced to form the mask 56 on this dielectric layer 52-2. The latter can then be etched, by anisotropic dry etching (reactive ion etching or ion milling). Mask 56 protects the portions which are not etched. A stack including both layers 42-1, 42-2, residual portion 42-3' of layer 42-3, and portion 52-2' which was not eliminated by etching of the dielectric layer 52-2 is therefore obtained (FIG. 3E).

Figure 3F:
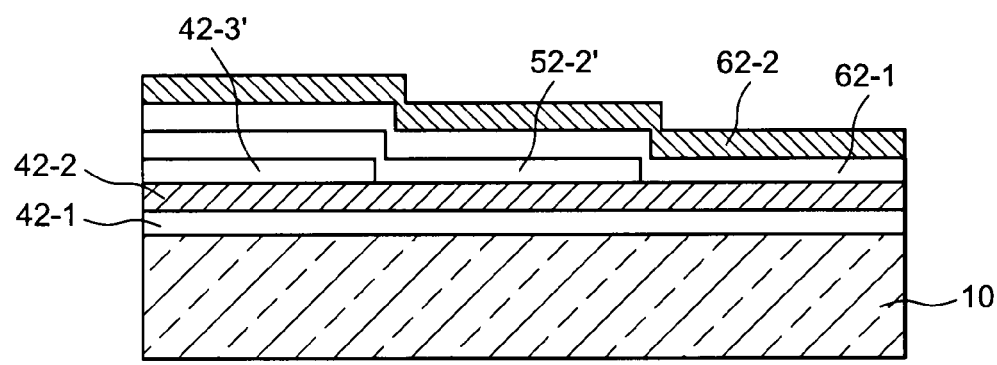
Figure 3G:
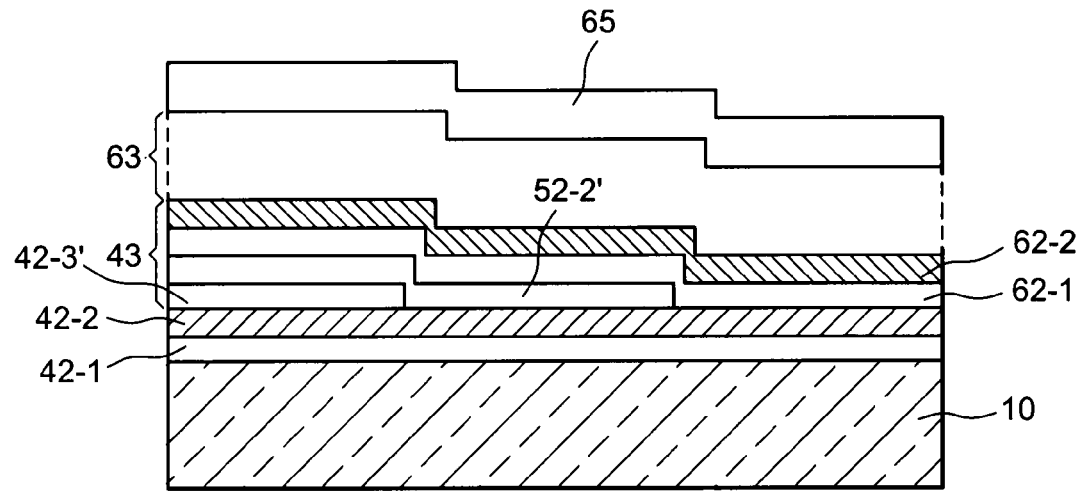

Mask layer 56 is removed, and a dielectric layer 62-1 is deposited, followed by a metal layer 62-2 (FIG. 3F). Layer 62-1 covers portion 52-2' of layer 52-2 which has been protected by the mask and the portion of layer 42-2 which was revealed during the etching of layer 52-2 (a dielectric/metal/dielectric/metal stack is therefore obtained).

It is then possible to deposit and form a stack 63 (identified in FIG. 3G but not represented in detail), similar to stack 43 including layers 42-3', 52-2', 62-1 and 62-2, where only the thicknesses of the layers differ from one stack to another. This stack 63 affects all three colours.

Finally, a buffer layer 65, which is optically neutral, is deposited above the last metal layer of stack 63.

Figure 3H:
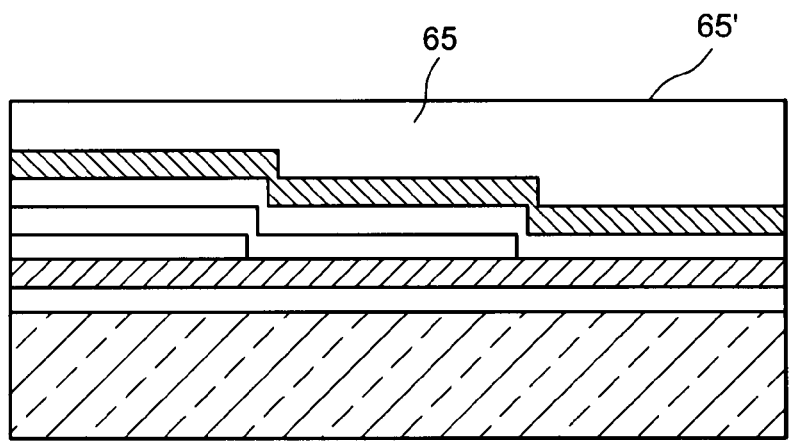

A step of planarisation may be accomplished, for example by chemical mechanical polishing of the entire structure, and stoppage in buffer layer 65 (FIG. 3H). A flat surface 65' is consequently obtained in or under which a matrix of coloured filters or pixels has been produced.

To produce a filter with 4 or more colours, all the steps relative to the production of second dielectric stack 52-2-56 (deposition, lithography and etching) are repeated within stacks 43 and 63.

For this method of FIGS. 3A-3H the same observation may be made as for the previous method, with regard to the result and advantages of a possible coverage: it is typically possible to obtain less than 4% of the area lost by the peripheral zones of the pixels; but the auto-alignment is not accomplished by CMP; during construction the filters are gradually produced with a coverage, which may be 100%, of the surface of the pixels.

According to a third method a filter is produced with coloured (pigments) or fluorescent nanoparticles (or particles). A nanoparticle is an aggregate of atoms or molecules measuring between 1 nm and 1000 nm. The use of such particles to produce a coloured or fluorescent filter has several advantages compared to the deposition of mere colourant molecules. With fluorescent filters the possibility is obtained of producing an image having an additional fluorescence effect compared to merely coloured images.

Firstly, the particles are larger than those of a molecule; they thus enable thicker layers to be obtained, a factor in favour of obtaining a high optical contrast.

In addition it is possible to functionalise the surface of the particles without changing their optical properties, in order to deposit them selectively on a substrate, and by this means to constitute a colour. Functionalisation of a particle is the term applied to the grafting of chemical molecules on this particle, for example by covalent bonding or physical adsorption.

However, modifying the chemical formula of a colourant-molecule can alter its optical properties.

Finally, crystallised particles or pigments of mineral or organic origin have resistances to radiation (UV, etc.) and temperature resistances which are far higher than organic molecules.

The coloured or fluorescent particles can be deposited as a single layer on the surface of a substrate by physical adsorption (which uses electrostatic interactions), or chemically, by covalent bonding with the atoms of this surface. To increase contrasts it is also possible to deposit several layers of pigments.

The particles can be of different maximum sizes or diameters (for example, between 1 nm and 1000 nm) and of different natures. Pigments which are resistant to radiations and to temperature are chosen in preference.

It is notably possible to choose any mineral particle, and in particular any oxide, such as an iron oxide, chromium oxide, manganese oxide, aluminium oxide or a spinel, or a chromium oxide or a cobalt oxide. Among the organic particles it is notably possible to choose pigments of the phtalocyanines type.

It is also possible to choose particles with a surface plasmon effect, of the Au, Ag, Pt, etc. type, or again organic molecules included in a mineral particle, for example indigo in a nanosized organoclay particle, etc., which gives the organic molecule great stability.

For greater thermal resistance, the particles can be coated (core-shell structures) with refractory materials of the aluminium, or zirconia, or zirconium type, etc., for example using the sol-gel technique. In this case, intermediate layers can be produced to adjust the optical indices.

The choice of the materials and size of the nanoparticles will be made according to the desired characteristics of the filters (central wavelength, breadth of the filter, optical absorption).

The nanoparticles can be deposited on a substrate by the sol gel method (as explained by Samar K. Medda et al. in J. Mater. Chem., 2005, 15, 3278-3284) or by grafting on a surface which has previously been functionalised selectively.

Depending on the choice of materials, the entire temperature range 200° C.-900° C. may be covered. For example, for 200° C., it is possible to have 5 nm particles of $SiO_2$ nm; for 900° C., it is possible to have a blend of $Al_2O_3$:Cr in 5 nm gold particles coated with zirconia (20 nm).

A filter of this type is less sensitive to the angle of observation than both previous types of filter. There is, indeed, a dependency between this sensitivity and the thickness of the material traversed by the light, which thickness is greater with an oblique angle of incidence. And a filter of the particles type has a single thin layer, and is therefore relatively thin (of the order of 100 nm).

The colorimetric properties of this type of filter are satisfactory. But the signal-to-noise ratio is less satisfactory than for the previous two types of filter, since this type of filter uses the absorption or diffusion resonance of the surface plasmon effect particles, and operates by the principle of complementary colours, which causes a substantial reconstruction noise in the processing of images, as explained by Richard L. Baer et al., Poorvi Vora, IS&T/SOPIE Conference on Sensors, Cameras and Applications for Digital Photography, 3650, 16-25, SPIE, "A comparison of primary and complementary color filters for CCD-based digital photography" (1999).

A method of manufacture to produce a coloured substrate with 3 colours, with deposits by grafting on a functionalised surface, is given below.

In the case of 4 or more colours, the method of production of a colour (lithography, etching, functionalisation, removal of resin before or after functionalisation, deposition) is repeated.

Localisation of the deposit of the 3 pigments for the fundamental colours blue, green and red can also be accomplished by differentiating the chemical nature of the 3 surfaces (for example, the latter are respectively made from Si, $SiO_2$ and $Si_3N_4$) if care has been taken to functionalise the particles with a different affinity for these 3 surfaces. The functionalisation of the particles is not shown in the figures; it is accomplished within layers 72-2', 82-2', etc.

Methods to produce these layers by deposition using sol-gel solutions can also be implemented.

To this end, a possible functionalised layer 72-1 is deposited on a transparent or opaque substrate 10, followed by a layer 72-2 of the first colour.

A mask 76 is then produced to delimit the first colour. A layer of photosensitive resin is therefore deposited, in which a lithograph is produced to form the mask.

Layers 72-1 and 72-2 can then be etched, by anisotropic dry etching (reactive ion etching or ion milling). Mask 76 protects the portions which are not etched. A stack including portions 72-1' and 72-2', which are not eliminated by etching, of layers 72-1 and 72-2, is therefore obtained (FIG. 4B).

A functionalised layer 82-1 is then deposited, and this is followed by the deposition of the second layer 82-2 for the second colour. Mask layer 76 is removed (FIG. 4C). It can be removed earlier, but keeping it whilst layers 82-2 and 82-1 are being deposited prevents deposition of these latter on layer 72-2'.

A mask 86 is then produced to delimit the second colour. A layer of photosensitive resin is therefore deposited, in which a lithograph is produced to form the mask.

Layers 82-1 and 82-2 can then be etched, by anisotropic dry etching (reactive ion etching or ion milling). Mask 86 protects the portions which are not etched. A stack including portions 82-1' and 82-2', which are not eliminated by etching, of layers 82-1 and 82-2, is therefore obtained (FIG. 4D). This stack adjoins the stack of portions 72-1' and 72-2', which are not eliminated by etching, of layers 72-1 and 72-2.

A functionalised layer 92-1 is then deposited, and this is followed by the deposition of a layer 92-2 for the third colour. Mask layer 86 is removed. It can be removed earlier, but keeping it whilst layers 92-2 and 92-1 are being deposited prevents deposition of these latter on layers 72-2' and 82-2'.

A buffer layer 96 may then be deposited (FIG. 4E). The assembly may then possibly be planarised by chemical mechanical polishing, with stoppage in this buffer layer 96 (FIG. 4F). A flat surface 96' is consequently obtained in or under which a matrix of coloured filters or pixels has been produced.

Using a substrate including a matrix 100 of coloured pixels, for example obtained using one of the methods described above, a colour image may be produced by partially obstructing or masking each colour, with a layer 104 (FIG. 5A) which is opaque to light.

This layer 104 is, for example, a temperature-resistant metal layer (Pt, W, TiN, Ti, etc.) which is more than 50 nm thick. It may also be a metal sandwich (dielectric/metal/dielectric) including a layer of this kind.

A possible sub-layer 102, for example made from titanium or TiO2, or TiN, or Ti:W, can enable the bonding of the metal of this metal layer to matrix 100 to be improved.

The obstructed surface is determined according to the greyscale of each colour in the original image, using a rasterisation principle used in printing (reference may be made, for example, to U.S. Pat. No. 4,680,645 for this aspect).

A mask 106 is produced to define the image. A layer of photosensitive resin is therefore deposited, in which a lithograph is produced to form mask 106 on matrix 100 (FIG. 5B).

The next step (FIG. 5C) is an etching of metal layer 104, or of the metal sandwich, by wet means (chemical etching) or by dry means (plasma etching, or reactive ion etching, or ion milling). Mask 106 is then eliminated.

A passivation layer 110 can then be formed on the assembly (FIG. 5C). Planarisation may be accomplished, for example by chemical mechanical polishing, and stoppage in flattened passivation layer 110' (FIG. 5D).

A single lithography level enables a colour image to be produced, with an alignment which can be produced with traditional lithography equipment. In other words, an image can be produced very rapidly, without implementing a succession of expensive steps. Starting with a substrate obtained by a method according to the invention, the desired image can then be produced simply in a mask superimposed on the said substrate.

The technique of production of an image which has just been described above nonetheless has risks of misalignment. In particular, it is possible that the portions of layer 104 which define the image may not be precisely centred and/or positioned in the locations where they should so be positioned.

For this reason it is possible to implement a variant, in which a negative of the image to be produced is etched in material layer 104.

This is illustrated in FIGS. 7A and 7B.

FIG. 7A represents, seen from above, the production of 3 pixels $107_1$, $107_2$, $107_3$, such as those of FIG. 5B, in which, for each pixel, central portions $104'_1$, $104'_2$, $104'_3$, of the mask layer are left in place, which central portions obstruct to a greater or lesser degree or cover the corresponding pixel underlying each of these portions, in accordance with the image which it is desired to produce.

FIG. 7B represents, seen from above, a variant, in which, for each pixel, not a central portion but a lateral portion of layer 104 is left in place, with an area equal to the area of the pixel minus that of central portion $104'_1$, $104'_2$, $104'_3$, of FIG. 7A. In this case it is the central portions $104''_1$, $104''_2$, $104''_3$, which are eliminated. In other words, central portions 104'' are revealed, surrounded by portions 104' which are not eliminated from layer 104. This embodiment is much more tolerant of a possible misalignment. In order to obtain, with each pixel $109_1$, $109_2$, $109_3$ of FIG. 7B, an effect equivalent to the one obtained with, respectively, each pixel $107_1$, $107_2$, $107_3$ of FIG. 7A, the central area—free of any mask—of each pixel $109_i$ (i=1, 2, 3) is modified such that it is roughly equal to that of the peripheral area—free of any mask—of each pixel $107_i$ (i=1, 2, 3) of FIG. 7A.

A method according to the invention may also include a step of formation of means to protect the image.

Indeed, the mechanical protection of an image is not always very robust on the side of flattened passivation layer 110', which is a thin film which is likely to be scratched.

An extremely robust product is obtained by assembling the substrate, with its image produced as explained above, with a protective substrate 120, which may be opaque or transparent, for example made of glass, or ceramic material, or sapphire, or diamond (FIG. 6A).

If substrate 10, with the image resulting, for example, from the method of FIGS. 5A-5D, is opaque, it is assembled with a transparent substrate 120. If substrate 10 is transparent it may be assembled with a substrate 120, which may be transparent or opaque. The protective substrate, whether opaque or transparent, may have a possible adhesion layer 122 for the purpose of assembly with the image substrate, for example by molecular bonding (FIG. 6A).

The surfaces to be assembled of the image substrate, firstly, and of the protective substrate 120, secondly, are cleaned and treated for the purpose of this assembly. The assembly or the transfer is preferably implemented by treatment of the surfaces to be assembled, without adding organic products.

The assembly may then be made by molecular bonding (FIG. 6B), consolidated by a possible consolidation annealing, for example at a treatment temperature of over 200° C.

When both substrates are transparent the image may be observed equally well in transmission from one side or the other.

In one case, depending on the choice in respect of the mask, it will however be reversed relative to the original.

The images obtained in this manner are durable, since they are hermetically positioned between two massive solid substrates: on one side there is the substrate with the image, which is several hundreds of µm thick (for example between 100 µm and 1000 µm) and, on the other, there is transfer substrate 120, which is of a similar or identical thickness.

If the bonding of the image substrate on substrate 120 is implemented by molecular bonding, a hermetic seal is obtained constituting a barrier to the diffusion of moisture or gaseous or liquid chemicals.

The images are mechanically protected by the full thicknesses of both substrates. The latter must be abraded or worn away completely before destroying the graphical element or the texts contained in the image.

For example, sapphire substrates 10, 120 are very hard (hardness 8 on the Mohs scale, with 10 classes) and can be scratched only by silicon carbide or diamond. Such substrates can therefore be considered to be hard-wearing in day-to-day uses by people.

The produced assembly is almost tamper-resistant, in particular if there is molecular bonding between the image substrate and the transfer substrate. Using this bonding technique the two substrates reconstitute a single solid. The bonding forces between the two substrates are then greater than the cohesive forces of the materials. Thus, any attempt to separate the substrate would cause the product to be destroyed.

The invention provides many advantages.

Firstly, the colour images produced are of very high quality. Each image is produced by lithography directly aligned with the coloured pixels. And the lithography machines used in microelectronics allow excellent alignment accuracies to be attained (of the order of 20 nm in certain cases). Thus, the level of each colour is correctly reproduced.

The present invention also allows a high density of analog data stock to be achieved. It enables a large quantity of colour images to be stored in analog form (no encoding or compression), in a very small area, through the use of microelectronics technologies, which enable micron-scale or even smaller dimensions to be attained. Thus, the volume occupied by the images' storage media is small.

Generally, the images are produced with mineral materials which are very stable (physically and chemically), and which are therefore insensitive or of low sensitivity to changes or deteriorations over time.

Due to the manufacturing materials and methods used the images can resist high-temperature exposures.

They will resist at least exposures at least 400° C. With a certain choice of materials and methods cited, as explained above, they will be able to resist exposures higher than 1000° C.

The invention can find applications in various industrial, cultural and artistic fields.

Firstly, it has applications in the field of luxury products. In the watchmaking industry, watch-glasses, case bases, faces and inlays can be manufactured by implementing the invention in order to produce colour images combining very high visual quality and a large quantity of data.

Objects in the jewellery field (for example pendants, earrings or rings) can be produced to incorporate images according to the invention. These images can also be added on by molecular bonding to precious or semiprecious stones acting as the transfer substrate.

Storage of data obtained by a method according to the invention is durable. Information and culture are preserved on media which are currently somewhat ephemeral or fragile, or which require permanent updates (books, IT, microfiches, etc). The invention enables a large quantity of data to be stored for posterity in small volumes (area of a few cm², and less than 2 mm thick) with satisfactory durability (resistance).

The qualities of an object produced according to the invention are particularly suitable for very varied applications, such as industries in which there are long-term undertakings. Traceability of the storage of nuclear waste may be mentioned in particular.

Indeed, the requirements of traceability of data concerning buried nuclear waste storage locations are several thousand years.

Other application examples are the following:
storage of plans of structures which are intended to have a long lifetime: for example, plans of aircraft, or plans of dams or civil engineering structures; in the case of all these objects it may be necessary to refer to their plan again, sometimes after more than 10 years, and sometimes even after several tens of years,
the problem of the conservation of climate data, which will prove of utility for much longer than a single generation.

The invention claimed is:

1. A method of producing a color image on or in a substrate, comprising:
    producing a colored or fluorescent substrate for purposes of forming a colored or fluorescent image, and before formation of such an image, the production of the colored or fluorescent substrate including:
        forming, on a substrate, a colored or fluorescent matrix, defining pixels of at least two different colors, wherein each pixel forms a filter for a given color, and
        wherein at least one filter is obtained with colored or fluorescent particles, of mineral or organic type, formed using surface plasmon effect particles of Au, Ag or Pt type, or using organic molecules included in a mineral matrix; and
    producing the image, fixed directly on or in the colored or fluorescent substrate by performing a lithography process to partially mask at least one color of the matrix.

2. A method according to claim 1, wherein the particles are coated in refractory materials of alumina, or zirconia, or zirconium type.

3. A method according to claim 2, wherein intermediate layers are produced on the particles to adjust optical indices, to reproduce an initial color or to change the initial color in controlled fashion.

4. A method according to claim 1, wherein the substrate includes a flat surface on which a pattern may be produced to form a color image.

5. A method according to claim 1, wherein the masking is accomplished with assistance of a metal mask.

6. A method according to claim 5, wherein the metal mask is made from Pt, or W, or TiN, or Ti.

7. A method according to claim 1, further comprising forming a protective substrate.

8. A method according to claim 7, wherein the protective substrate is assembled with the colored or fluorescent matrix by molecular bonding.

9. A method according to claim 1, wherein the substrate is transparent at at least one wavelength of at least one of the colors of the matrix.

10. A method according to claim 1, wherein the given color for each pixel is visible on either side of the pixel.

11. A method for producing a colored or fluorescent substrate for purposes of forming a colored or fluorescent image, and before formation of such an image, the method comprising:
    forming, on an upper surface of a transparent substrate, a colored or fluorescent matrix, defining pixels of at least two different colors, wherein each pixel forms a filter for a given color,
    wherein each pixel forms a dielectric-dielectric or metal-dielectric interferential filter, and wherein the pixels are formed by successive deposition steps of depositing different layers, each having different optical characteristics, over the substrate, while selectively etching a portion of at least one of the different layers between successive deposition steps, wherein after the etching of the portion of the at least one of the different layers between successive deposition steps, and prior to a subsequent deposition of another one of the different layers, the remaining non-etched portion of the at least one of the different layers which corresponds to one of the pixel colors, overlaps at least a portion of an adjacent pixel region corresponding to a different one of the pixel colors.

12. A method according to claim 11, wherein the filter is a dielectric-dielectric interferential filter including an alternating stack of mineral layers.

13. A method according to claim 11, wherein the filter is a metal-dielectric interferential filter including an alternating dielectric-metal stack.

14. A method according to claim 11, wherein the substrate includes a flat surface on which a pattern may be produced to form a color image.

15. A method of producing a color image on or in a substrate, including a method of production of a colored or fluorescent substrate according to claim 11, followed by production of the image, directly on or in the colored or fluorescent substrate.

16. A method according to claim 11, wherein the substrate is transparent at at least one wavelength of at least one of the colors of the matrix.

17. A method according to claim 11, wherein the given color for each pixel is visible on either side of the pixel.

18. A method according to claim 11, wherein the remaining non-etched portion of the at least one of the different layers overlaps only a portion of the adjacent pixel region.

19. A method according to claim 11, wherein the remaining non-etched portion of the at least one of the different layers covers all of the adjacent pixel region.

* * * * *